(12) United States Patent
Park

(10) Patent No.: US 7,889,595 B2
(45) Date of Patent: *Feb. 15, 2011

(54) SEMICONDUCTOR MEMORY DEVICE

(75) Inventor: Jung-Hoon Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 101 days.

This patent is subject to a terminal disclaimer.

(21) Appl. No.: 12/346,134

(22) Filed: Dec. 30, 2008

(65) Prior Publication Data

US 2010/0054073 A1 Mar. 4, 2010

(30) Foreign Application Priority Data

Sep. 2, 2008 (KR) .................. 10-2008-0086271

(51) Int. Cl.
*G11C 8/00* (2006.01)
(52) U.S. Cl. .................. 365/233.1; 365/233.13; 365/230.06
(58) Field of Classification Search .......... 365/194, 365/233.1, 233.11, 233.12, 233.13, 236, 365/230.06; 327/158, 156, 161
See application file for complete search history.

(56) References Cited

U.S. PATENT DOCUMENTS

| | | | |
|---|---|---|---|
| 5,973,525 A * | 10/1999 | Fujii | 327/158 |
| 6,801,093 B2 * | 10/2004 | Kuwajima | 331/18 |
| 7,414,446 B2 * | 8/2008 | Kim | 327/158 |
| 2008/0069285 A1 * | 3/2008 | Kon et al. | 375/376 |
| 2008/0192563 A1 * | 8/2008 | Cho | 365/233.17 |
| 2010/0054059 A1 * | 3/2010 | Yoon et al. | 365/194 |

FOREIGN PATENT DOCUMENTS

KR 1020010073884 A 8/2001
KR 1020080044543 A 5/2008

OTHER PUBLICATIONS

Notice of Allowance issued from Korean Intellectual Property Office on Oct. 30, 2009.

* cited by examiner

*Primary Examiner*—Gene N. Auduong
(74) *Attorney, Agent, or Firm*—IP & T Group LLP

(57) ABSTRACT

A semiconductor memory device includes a clock inputting unit configured to receive a system clock and a data clock, a clock dividing unit configured to divide a frequency of the data clock to generate a data division clock and determining a phase of the data division clock according to a division control signal, a phase dividing unit configured to generate a plurality of multiple-phase data division clocks each having a predetermined phase difference according to the data division clock, and a first phase detecting unit configured to detect a phase of the system clock based on a predetermined selection clock among the multiple-phase data division clocks, and generate the division control signal according to the detection result.

35 Claims, 10 Drawing Sheets

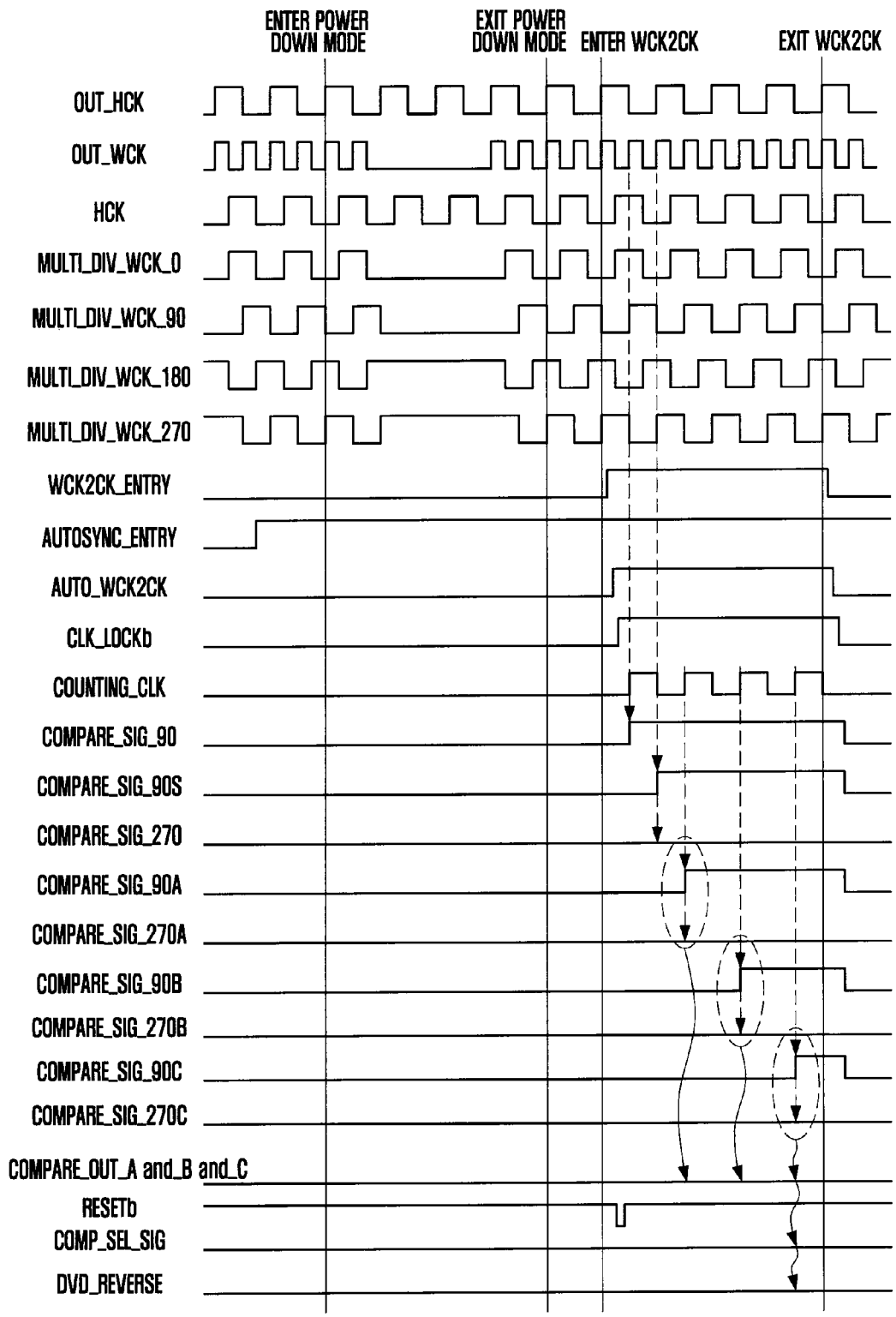

SEMICONDUCTOR MEMORY DEVICE

CROSS-REFERENCE TO RELATED APPLICATIONS

This application claims priority to Korean patent application number 10-2008-0086271, filed on Sep. 2, 2008, which is incorporated by reference in its entirety.

BACKGROUND OF THE INVENTION

The present subject matter relates to a semiconductor design technology, and in particular, to a clock alignment training operation, which is required in a high-speed semiconductor memory device. More particularly, the present subject matter relates to a circuit, which can reduce time taken for a clock alignment training operation in a semiconductor memory device.

In a system including a plurality of semiconductor memory devices, the semiconductor memory devices are used for storing data. When a data processor such as a memory control unit (MCU) requests data, the semiconductor memory device outputs data corresponding to an address input from the data processor requesting data. The semiconductor memory device also stores data provided from the corresponding data processor in a position corresponding to the address.

To this end, a high-speed semiconductor memory device, which has been developed in recent times, is designed to input/output two data between a rising edge and a falling edge of an external system clock and to input/output two data between the falling edge and the following rising edge of the external system clock. That is, the high-speed semiconductor memory device is designed to input/output four data in one cycle of a system clock.

However, since the system clock is merely represented as two states, i.e., logic high or logic low, a data clock having a frequency two times faster than that of the system clock is required for inputting/outputting four data in one cycle. That is, a dedicated clock for input/output of data is, therefore, required.

Accordingly, when an address and a command are received/transmitted, the high-speed semiconductor memory device uses the system clock as a reference clock. When data are inputted/outputted, the high-speed semiconductor memory device uses the data clock as the reference clock and performs a control in order for the data clock to have the frequency two times faster than that of the system clock.

That is, the high-speed semiconductor memory device repeats two cycles of the data clock in one cycle of the system clock, and inputs/outputs data at a rising edge and a falling edge of the data clock, respectively. Therefore, the high-speed semiconductor memory device can input/output four data in one cycle of the system clock.

In this way, the high-speed semiconductor memory device exchanges data using two clocks having different frequencies for performing a read or write operation, as opposed to a conventional Double Data Rate (DDR) synchronous memory device which uses one system clock as a reference clock for performing a read or write operation.

However, if a phase of the system clock and a phase of the data clock are not aligned, then a reference for transfer of an operation command and an address and a reference for transfer of data are not aligned. This denotes that the high-speed semiconductor memory device cannot operate normally.

Therefore, to normally operate the high-speed semiconductor memory device, an interface training operation between the high-speed semiconductor memory device and a data process device must be performed at an initial operation. That is, the interface training is a training performed before a normal operation between the semiconductor memory device and the data process device in order for those devices to operate when an interface for transferring commands, addresses, and data is optimized.

The interface training is divided into an address training, a clock alignment training (WCK2CK training), a read training, and a write training. In the clock alignment training (WCK2CK training), the data clock and the system clock are aligned.

FIG. 1 is a block diagram of a circuit for performing the clock alignment training in accordance with a conventional technology.

First, in the basic principle of the clock alignment training, the high-speed semiconductor memory device receives an address signal and a command signal from an external controller on the basis of a system clock HCK, and outputs data stored in the semiconductor memory device to the external controller on the basis of a data clock WCK as described above.

Accordingly, when there is a phase difference between the system clock HCK and the data clock WCK, the data stored in the semiconductor memory device reach the external controller more quickly or more slowly by a time corresponding to the phase difference.

Consequently, the clock alignment training is an operation where the high-speed semiconductor memory device detects a phase difference between the data clock WCK and the system clock HCK applied from the external controller at an initial operation and transmits the detection result to the external controller, and thus reduces the phase difference between the system clock HCK and the data clock WCK.

That is, in the circuit for performing the clock alignment training in accordance with the conventional technology illustrated in FIG. 1, the circuit receives and buffers the data clock OUT_WCK and the system clock OUT_HCK from the external controller and outputs the buffered data clock WCK and the buffered system clock HCK, detects the phase difference between the data clock WCK and the system clock HCK, and transmits the detection result to the external controller.

Referring to FIG. 1, the circuit includes a clock inputting unit 100, a clock dividing unit 120, a phase detecting unit 140, and a signal transmitting unit 160. The clock inputting unit 100 receives the system clock HCK for synchronizing an input time of the address signal and an input time of the command signal and the data clock WCK, which has higher frequency than that of the system clock HCK, for synchronizing an input time of the data signal from the external controller.

The clock dividing unit 120 divides a frequency of the data clock WCK to generate a data division clock DIV_WCK in order for the data division clock DIV_WCK to have the same frequency as that of the system clock HCK. The phase detecting unit 140 detects a phase difference between the system clock HCK and the data division clock DIV_WCK and generates a detection signal DET_SIG corresponding to the detection result. The signal transmitting unit 160 transmits the detection signal DET_SIG as a training information signal TRAINING_INFO_SIG to the external controller.

FIG. 2 is a timing diagram illustrating an operation waveform of the circuit for performing the clock alignment training in accordance with the conventional technology of FIG. 1.

Referring to FIG. 2, although a frequency of the data clock WCK, which is inputted to the circuit for performing the clock alignment training from the external controller, is higher than that of the system clock HCK, it can be seen that a frequency of the data division clock DIV_WCK outputted from the clock dividing unit 120 is the same as that of the system clock HCK, because the clock dividing unit 120 changes a frequency of the data clock WCK in order for the frequency of the data clock WCK to be the same as that of the system clock HCK.

Moreover, it can be seen that clock edges are not synchronized with one another at the moment ① before performing the clock alignment training operation. That is, the phase of the data clock WCK and the phase of the data division clock DIV_WCK are not synchronized with the phase of the system clock HCK at the moment ① before performing the clock alignment training operation.

It can be seen that the circuit changes the phase of the data clock WCK and the phase of the data division clock DIV_WCK in a state where the phase of the system clock HCK is constant in order to synchronize the phase of the data clock WCK and the phase of the data division clock DIV_WCK with the phase of the system clock HCK at moments ②, ③, ④, ⑤, and ⑥ after starting the clock alignment training operation.

At this point, the phase of the data clock WCK is changed according to a logic level of the training information signal DET_SIG (TRAINING_INFO_SIG) transmitted to the external controller by the signal transmitting unit 160. That is, since the logic level of the training information signal DET_SIG (TRAINING_INFO_SIG) continuously is a logic low state, the external controller gradually changes the phase of the data clock WCK and applies the data clock WCK to the circuit for performing the clock alignment training.

Then, at the moment ⑥ where the phase of the data clock WCK and the phase of the data division clock DIV_WCK are synchronized with the phase of the system clock HCK, the logic level of the training information signal DET_SIG (TRAINING_INFO_SIG) is changed from a logic low state into a logic high state. In a section ⑦ where the logic level of the training information signal DET_SIG (TRAINING_INFO_SIG) is continuously maintained as the logic high, the phases of the data clock WCK and the data division clock DIV_WCK are no longer changed. That is, since there is a state where the logic level of the training information signal DET_SIG (TRAINING_INFO_SIG) is changed into the logic high, the external controller makes the phase of the data clock WCK constant and applies the data clock WCK to the circuit for performing the clock alignment training.

As a result, it can be seen that the circuit for performing the clock alignment training continuously compares the phase of the data clock WCK with the phase of the system clock HCK through the phase detecting unit 140 and transfers the comparison result, i.e., the training information signal DET_SIG (TRAINING_INFO_SIG) to the external controller until the phases of the data clock WCK inputted from the external controller are synchronized with the phase of the system clock HCK through the clock alignment training operation.

The reason why the circuit for performing the clock alignment training is included in a semiconductor memory device is to synchronize the phase of the data clock WCK with the phase of the system clock HCK by performing the clock alignment training operation at a time when a power supply voltage is first applied to the semiconductor memory device, i.e., a power up time.

However, the circuit must synchronize the phase of the data clock WCK with the system clock HCK by performing the clock alignment training operation even at a time when it exits from an operation mode such as a power down mode required for the reduction of the power consumption of the semiconductor memory device. The reason is stated hereafter. In a state where the circuit enters an operation mode such as the power down mode, since data are not inputted/outputted in the semiconductor memory device so that only the system clock HCK is inputted to the semiconductor memory device and the data clock WCK is not inputted to the semiconductor memory device, the phase of the data clock WCK may not be synchronized with the phase of the system clock HCK due to the change of the phase of the data clock WCK in a case that the circuit exits from the operation mode such as the power down mode and the data clock WCK is again inputted to the semiconductor memory device.

At this point, in an entry/exit process of the operation mode such as the power down mode, since a jitter component occurs in the data clock WCK due to noise, the phase of the data clock WCK may be changed. However, occurrence probability of the phase change is very low, and the time taken for synchronizing the phase of the data clock WCK with the phase of the system clock HCK through the clock alignment training operation is very short, even though the phase change occurs. Accordingly, the phase change of the data clock WCK cannot exert influence on the total operations of the semiconductor memory device.

Above all, among the elements of the circuit for performing the clock alignment training operation of FIG. 1, the clock dividing unit 120 is turned on/off and a clock division time is changed in an entry/exit process of the operation mode such as the power down mode, and thus the phase of the data clock WCK can be inverted. In a case that the phase inversion occurs, since the phase of the data clock WCK must be changed by more than ½tCK for again synchronizing the phase of the data clock WCK with the phase of the system clock HCK through the clock alignment training operation, the phase change takes a very long time, and consequently the total operations of the semiconductor memory device can largely be delayed.

These problems can be serious as the frequency of the system clock HCK and the frequency of the data clock WCK decrease.

SUMMARY OF THE INVENTION

Embodiments of the present invention are directed to provide a semiconductor memory device, which supports an auto clock alignment training mode which is used upon entry/exit operation of an operation mode such as a power down mode of the semiconductor memory device independently from a normal clock alignment training mode which is used upon power-up operation of the semiconductor memory device, thereby reducing time taken by a clock alignment training operation in the semiconductor memory device.

According to an aspect of the disclosure, there is provided a semiconductor memory device, which includes a clock inputting unit configured to generate a system clock and a data clock, a clock dividing unit configured to generate a data division clock by dividing a frequency of the data clock and to determine a phase of the data division clock according to a division control signal, a phase dividing unit configured to generate a plurality of multiple-phase data division clocks each having a predetermined phase difference according to the data division clock, and a first phase detecting unit configured to detect a phase of the system clock based on a predetermined selection clock among the multiple-phase data division clocks, and generate the division control signal according to the detection result.

According to another aspect of the disclosure, there is provided an operation method of a semiconductor memory device, which includes receiving a system clock and a data clock, dividing a frequency of the data clock to generate a data division clock, wherein a phase of the data division clock is determined according to a division control signal, sensing an entry of a normal training mode or an entry of an auto training mode, generating a plurality of multiple-phase data division clocks having respective predetermined phase differences according to the data division clock when the auto training mode is entered according to the sensing result, and detecting a phase of the system clock and a phase of a predetermined selection clock among the multiple-phase data division clocks, and determining a logic level of the division control signal according to the detecting result.

BRIEF DESCRIPTION OF THE DRAWINGS

FIG. 7 is a timing diagram of input/output signals for describing a non-inversion operation of the circuit for performing the clock alignment training in accordance with an embodiment of the present invention.

DESCRIPTION OF SPECIFIC EMBODIMENTS

Other objects and advantages of the present subject matter can be understood by the following description, and become apparent with reference to the embodiments of the present invention. The present subject matter may, however, be embodied in different forms and should not be construed as limited to the embodiments set forth herein. Rather, these embodiments are provided so that this disclosure will be thorough and complete, and will fully convey the scope of the present subject matter to those skilled in the art.

Figure 1:
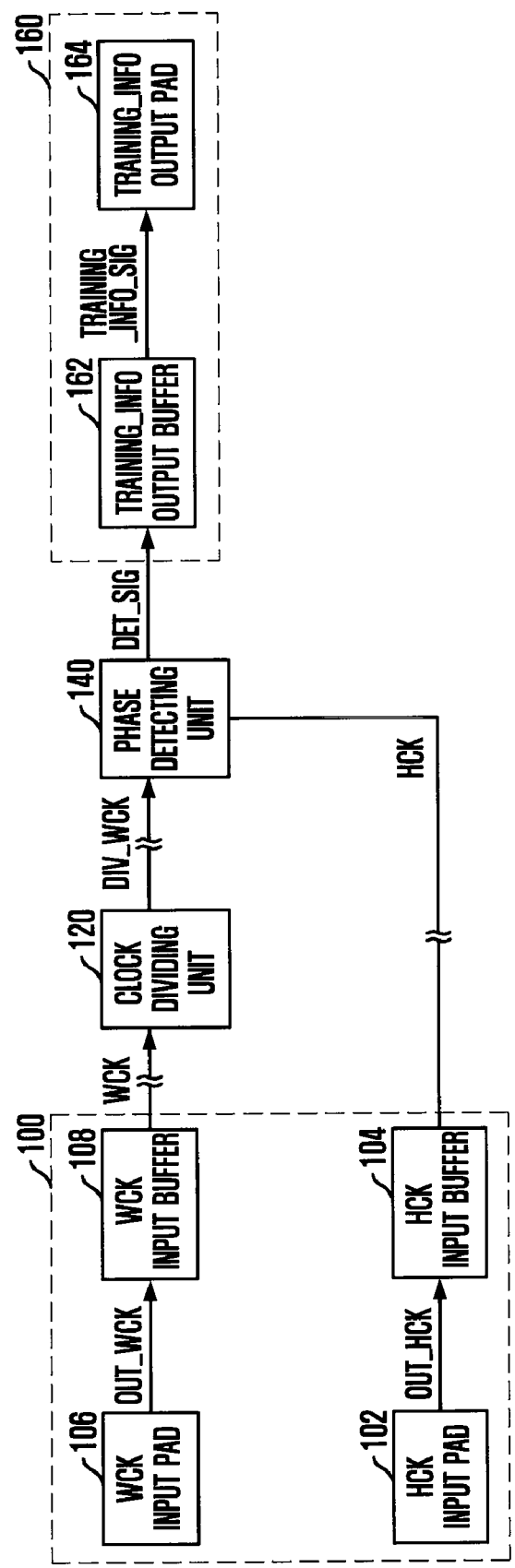
FIG. 1 is a block diagram of a circuit for performing clock alignment training in accordance with a conventional technology.
Figure 2:
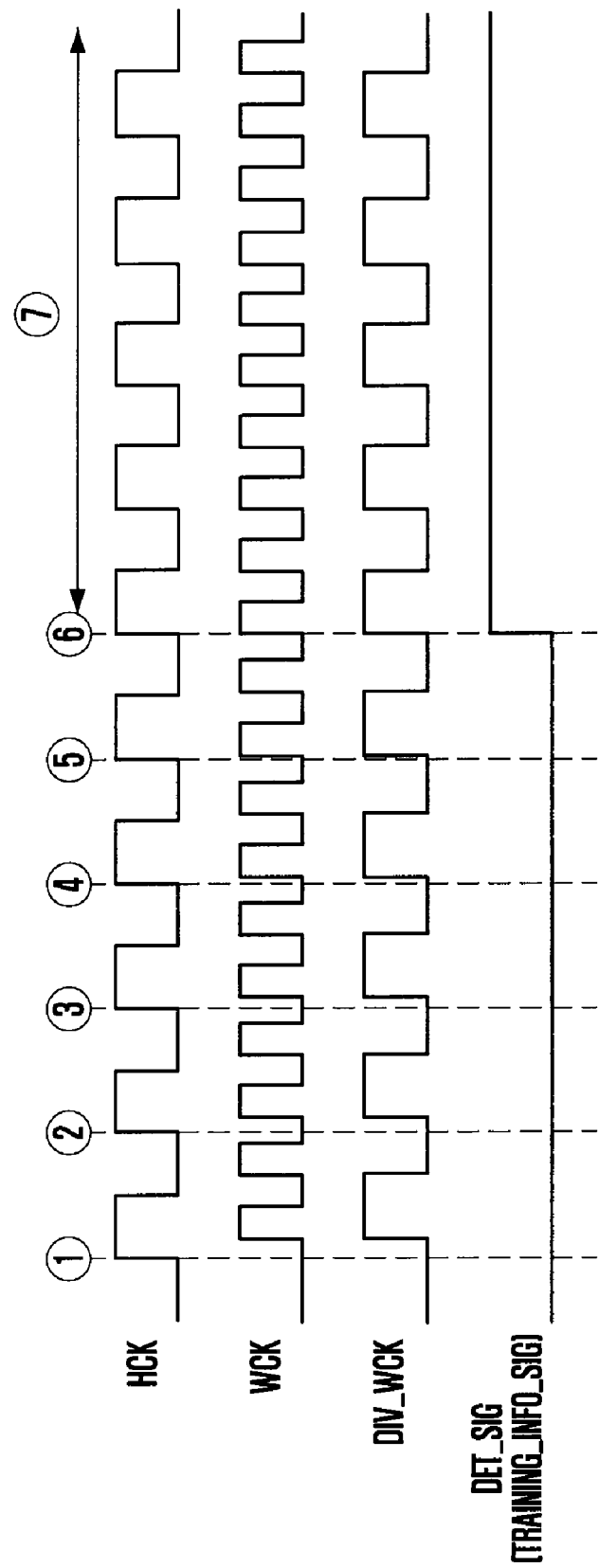
FIG. 2 is a timing diagram illustrating an operation waveform of the circuit for performing the clock alignment training in accordance with the conventional technology of FIG. 1.
Figure 3:
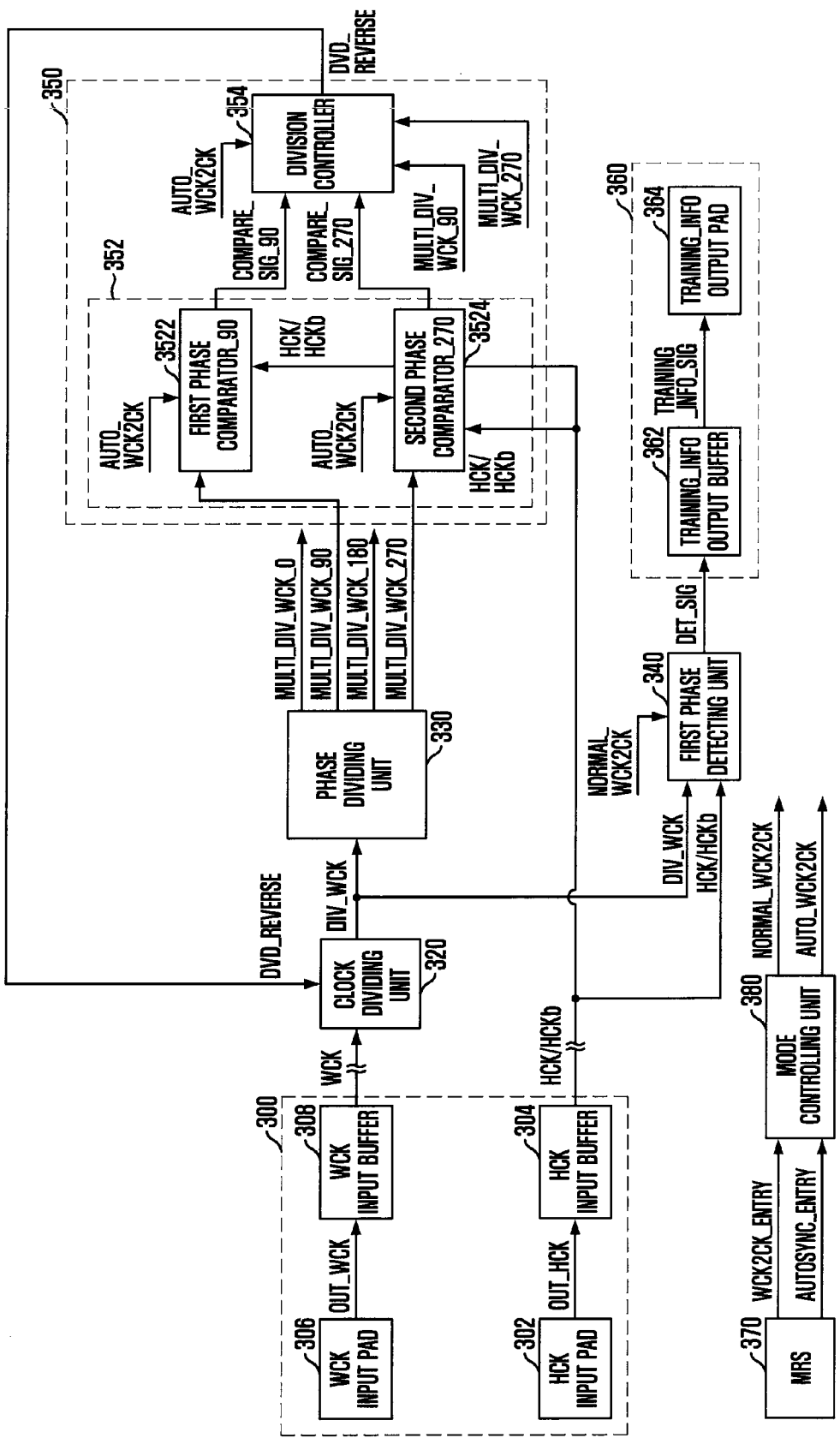
FIG. 3 is a block diagram of a circuit for performing clock alignment training in accordance with an embodiment of the present invention.

FIG. 3 is a block diagram of a circuit for performing clock alignment training in accordance with an embodiment of the present invention.

Referring to FIG. 3, the circuit for performing the clock alignment training in accordance with the embodiment of the present invention includes a clock inputting unit 300, a clock dividing unit 320, a first phase detecting unit 340, a signal transmitting unit 360, a phase dividing unit 330, and a second phase detecting unit 350.

The clock inputting unit 300 generates a system clock HCK and a data clock WCK in response to an external system clock OUT_HCK and an external data clock OUT_WCK, which has a frequency higher than that of the external system clock OUT_HCK, respectively. The external system clock OUT_HCK and the external data clock OUT_WCK are inputted from the external controller for synchronizing an input time of an address signal and an input time of a command signal and for synchronizing an input time of a data signal, respectively.

The clock dividing unit 320 divides a frequency of the data clock WCK to generate a data division clock DIV_WCK in order for the data division clock DIV_WCK to have the same frequency as that of the system clock HCK, wherein the clock dividing unit 320 inverts the phase of the data division clock DIV_WCK according to a division control signal DVD_RE-VERSE. The first phase detecting unit 340 detects a phase difference between the system clock HCK and the data division clock DIV_WCK in a normal training mode (which denotes that a normal training operation signal NORMAL_WCK2CK is activated) and generates a detection signal DET_SIG corresponding to the detection result.

The signal transmitting unit 360 transmits the detection signal DET_SIG as a training information signal TRAINING_INFO_SIG to the external controller. The phase dividing unit 330 generates a plurality of multiple-phase data division clocks MULTI_DIV_WCK_0, MULTI_DIV_WCK_90, MULTI_DIV_WCK_180 and MULTI_DIV_WCK_270 having the predetermined phase differences one another in response to the data division clock DIV_WCK. The second phase detecting unit 350 detects the phase of the system clock HCK on the basis of phases of selection clocks MULTI_DIV_WCK_90 and MULTI_DIV_WCK_270 in an auto training mode (which means that an auto training operation signal AUTO_WCK2CK is activated) and generates the division control signal DVD_REVERSE corresponding to the detection result. The selection clocks among the multiple-phase data division clocks are clocks, of which phases are not the same as, and not contrary to the phase of the data division clock DIV_WCK.

Moreover, the circuit further includes a mode controlling unit 380 activating or deactivating the normal training operation signal NORMAL_WCK2CK for controlling the operation of the normal training mode and the auto training operation signal AUTO_WCK2CK for controlling the operation of the auto training mode, in response to a clock alignment training operation entry signal WCK2CK_ENTRY and an auto sync operation entry signal AUTOSYNC_ENTRY. The clock alignment training operation entry signal WCK2CK_ENTRY and the auto sync operation entry signal AUTOSYNC_ENTRY are predefined and preset in a Mode Register Set (MRS) 370 for controlling the entry of the clock alignment training operation and for controlling which clock alignment training operation is performed upon entry of the clock alignment training operation, respectively.

The second phase detecting unit 350 includes a phase comparator 352 comparing phases of the selection clocks MULTI_DIV_WCK_90 and MULTI_DIV_WCK_270 with the phase of the system clock HCK in the operation section of the auto training mode, and a division controller 354 controlling the logic level of the division control signal DVD_REVERSE in response to the output signals COMPARE_SIG_90 and COMPARE_SIG_270 of the phase comparator 352 in the operation section of the auto training mode.

The clock inputting unit 300 includes a system clock input pad 302 receiving the external system clock OUT_HCK applied from an external controller, a system clock input buffer 304 buffering the external system clock OUT_HCK transferred through the system clock input pad 302 and outputting the system clock HCK, a data clock input pad 306 receiving the external data clock OUT_WCK applied from the external controller, wherein the external data clock OUT_WCK has a frequency higher than that of the external system clock OUT_HCK HCK applied from the external controller, and a data clock buffer 308 buffering the external data clock OUT_WCK transferred through the data clock input pad 306 and outputting the data clock WCK.

The signal transmitting unit 360 includes a training information signal output buffer 362 generating the training information signal TRAINING_INFO_SIG by buffering the detection signal DET_SIG inputted from the first phase detecting unit 340, and a training information signal output pad 364 transmitting the training information signal TRAINING_INFO_SIG buffered by the training information signal output buffer 362 to the external controller.

Figure 4:
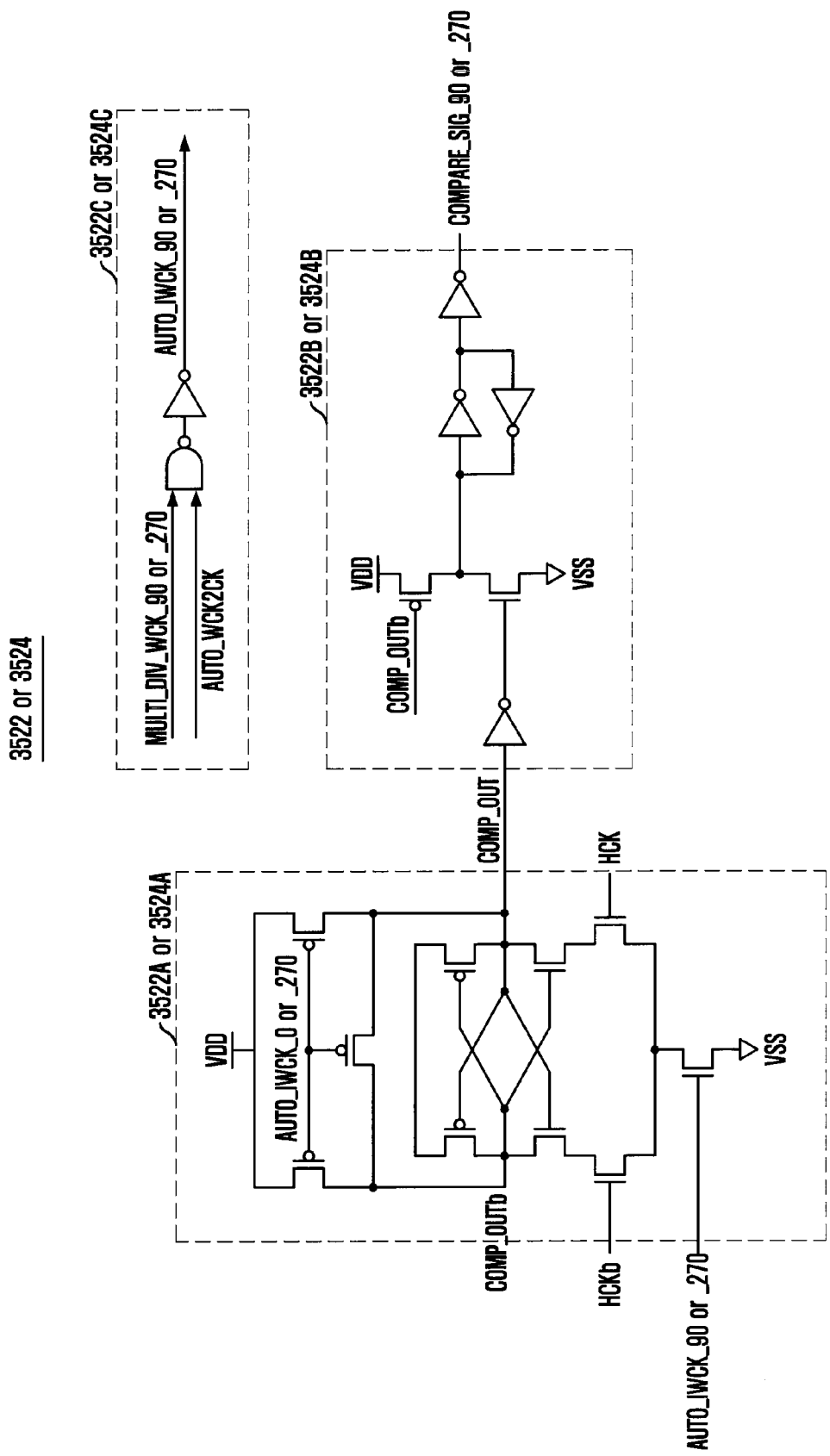
FIG. 4 is a detailed circuit diagram of a phase comparator included in a second phase detecting unit of the circuit for performing the clock alignment training in accordance with an embodiment of the present invention of FIG. 3.

FIG. 4 is a detailed circuit diagram of the phase comparator included in the second phase detecting unit of the circuit for performing the clock alignment training in accordance with an embodiment of the present invention of FIG. 3.

The phase comparator 352 of the second phase detecting unit 350 includes a first phase comparator 3522 comparing the phase of the system clock HCK with the phase of a first selection clock MULTI_DIV_WCK_90 having a 90-degree phase difference with respect to the data division clock DIV_WCK, and a second phase comparator 3524 comparing the phase of the system clock HCK with the phase of the second selection clock MULTI_DIV_WCK_270 having a 270-degree phase difference with respect to the data division clock DIV_WCK.

That is, signals inputted to (outputted from) the first phase comparator 3522 and the second phase comparator 3524, i.e., the first selection clock MULTI_DIV_WCK_90 and the second selection clock MULTI_DIV_WCK_270 (the signal COMPARE_SIG_90 and the signal COMPARE_SIG_270), may be different from each other. However, since the total operations of the first phase comparator 3522 are the same as the total operations of the second phase comparator 3524, the detailed internal circuit of the first phase comparators 3522 is the same as the detailed internal circuit of the second phase comparators 3524 as illustrated in FIG. 4.

Additionally, the phase comparator 352 of the second phase detecting unit 350 includes a first phase comparator 3522 comparing the phase of the system clock HCK with the phase of a first selection clock MULTI_DIV_WCK_90 having the 90-degree phase difference with respect to the data division clock DIV_WCK and a second phase comparator 3524 comparing the phase of the system clock HCK with the phase of the second selection clock MULTI_DIV_WCK_270 having the 270-degree phase difference with respect to the data division clock DIV_WCK, but this is merely one embodiment for clarity. In an actual design, the phase comparator 352 may include a phase comparing unit for comparing the phase of the system clock HCK with the phase of a selection clock MULTI_DIV_WCK_X having an X-degree phase difference with respect to the data division clock DIV_WCK.

Referring to FIG. 4, the first phase comparator 3522 includes a signal converting unit 3522C a comparison amplifying unit 3522A, and a logic level determining unit 3522B. The signal converting unit 3522C converts the selection clock MULTI_DIV_WCK_90 into an auto selection clock AUTO_IWCK_90 for driving the phase comparator 352 only in the operation section of the auto training mode in response to the auto training operation signal AUTO_WCK2CK.

The comparison amplifying unit 3522A configured in a sense-amplification type compares the phase of the system clock HCK with respect to the phase of the auto selection clock AUTO_IWCK_90. The logic level determining unit 3522B determines the logic level of the output signal COMPARE_SIG_90 in response to output signals COMP_OUT and COMP_OUTb of the comparison amplifying unit 3522A. Since the second phase comparator 3524 may have configuration same as the first phase comparator 3522, detailed description is omitted.

Additionally, the detail circuit of the phase comparator 352 of FIG. 4 is merely one embodiment for clarity, and it may actually be configured in a circuit type which is different from the circuit type of FIG. 4. That is, a circuit capable of fully performing the operation of the phase comparator 352 to be described below may be included and used in an embodiment of the present invention instead of the detail circuit of the phase comparator 352 of FIG. 4.

Figure 5:
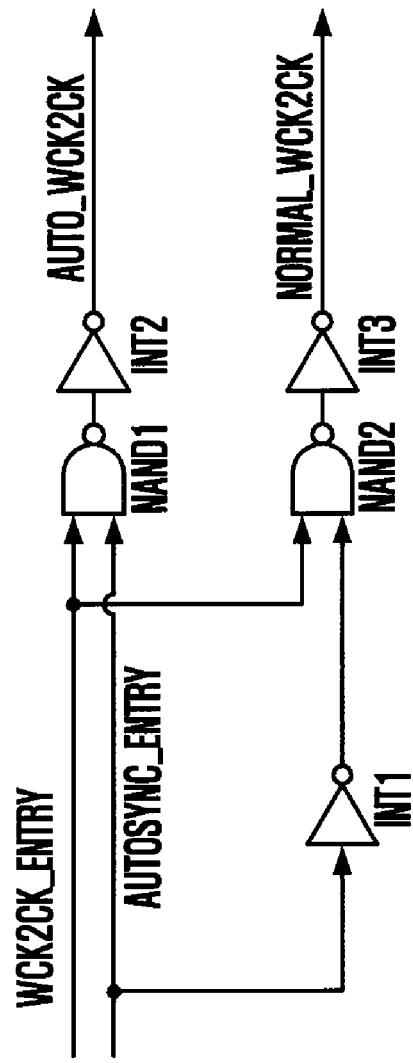
FIG. 5 is a detailed circuit diagram of the mode controller of the circuit for performing the clock alignment training in accordance with an embodiment of the present invention of FIG. 3.

FIG. 5 is a detailed circuit diagram of the mode controller of the circuit for performing the clock alignment training in accordance with an embodiment of the present invention of FIG. 3.

Referring to FIG. 5, the mode controlling unit 380 includes a first NAND gate NAND1 receiving the auto sync operation entry signal AUTOSYNC_ENTRY and the clock alignment training operation entry signal WCK2CK_ENTRY predefined in the MRS 370, performing a NAND operation on the received signals, and outputting the resultant signal of the NAND operation, a first inverter INV1 receiving the auto sync operation entry signal AUTOSYNC_ENTRY, inverting the phase of the received signal, and outputting the inverted signal, a second NAND gate NAND2 receiving the clock alignment training operation entry signal WCK2CK_ENTRY and the output signal of the first inverter INV1, performing a NAND operation on the received signals, and outputting the result signal of the NAND operation, a second inverter INV2 receiving the output signal of the first NAND gate NAND1, inverting the phase of the received signal, and outputting the inverted signal as the auto training operation signal AUTO_WCK2CK, and a third inverter INV3 receiving the output signal of the second NAND gate NAND2, inverting the phase of the received signal, and outputting the inverted signal as the normal training operation signal NORMAL_WCK2CK.

Figure 6A:
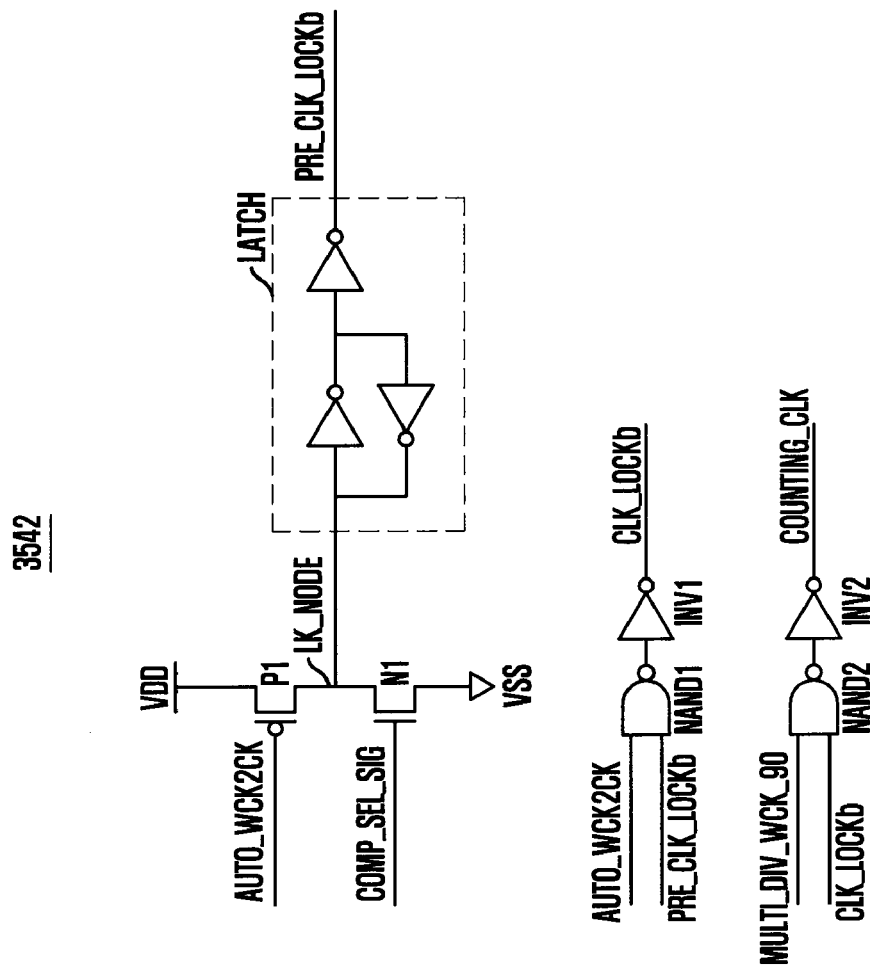
FIGS. 6A to 6C are detailed circuit diagrams of a division controller included in the second phase detecting unit of the circuit for performing the clock alignment training in accordance with an embodiment of the present invention of FIG. 3.
Figure 6B:
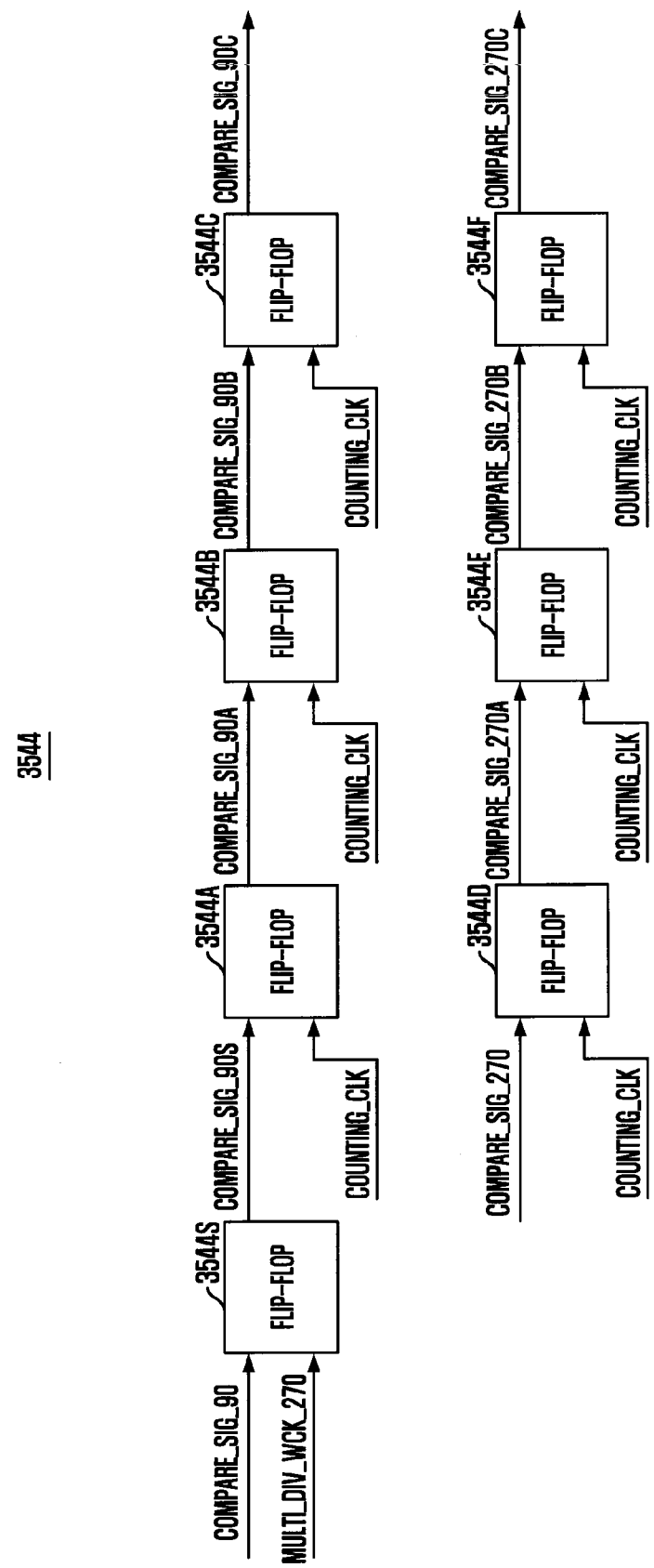
Figure 6C:
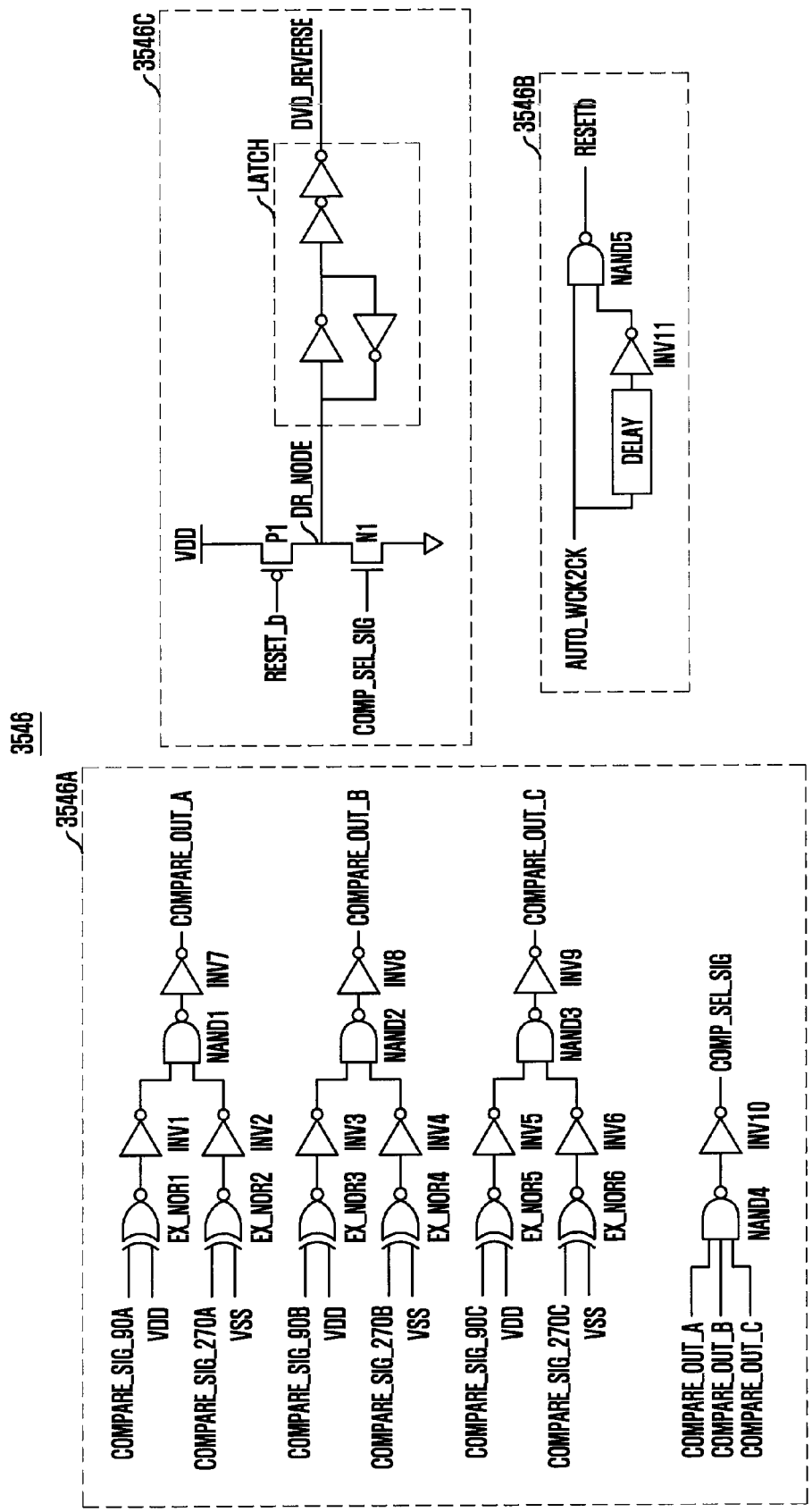

FIGS. 6A to 6C are detailed circuit diagrams of the division controller included in the second phase detecting unit of the circuit for performing the clock alignment training in accordance with an embodiment of the present invention of FIG. 3.

The division controller 354 of the second phase detecting unit 350 includes a counting clock generator 3542, a comparison information signal generator 3544, and a logic level determiner 3546 (not shown in FIG. 3). The counting clock generator 3542 generates a counting clock COUNTING_CLK synchronized with the selection clocks MULTI_DIV_WCK_90 and MULTI_DIV_WCK_270 in response to a comparison section signal COM_SEL_SIG in the operation section of the auto training mode.

The comparison information signal generator 3544 generates a plurality of comparison information signals COMPARE_SIG_90S, COMPARE_SIG_90A, COMPARE_SIG_90B, COMPARE_SIG_90C, COMPARE_SIG_270A, COMPARE_SIG_270B and COMPARE_SIG_270C, wherein the logic levels of the comparison information signals are sequentially determined according to the output signals COMPARE_SIG_90 and COMPARE_SIG_270 of the phase comparator 352 which are inputted at each time corresponding to the counting clock COUNTING_CLK. The logic level determiner 3546 determines the logic level of the comparison section signal COMP_SEL_SIG and the logic level of the division control signal DVD_REVERSE in response to the comparison information signals COMPARE_SIG_90S, COMPARE_SIG_90A, COMPARE_SIG_90B, COMPARE_SIG_90C, COMPARE_SIG_270A, COMPARE_SIG_270B, and COMPARE_SIG_270C.

Referring to FIG. 6A, the counting clock generator 3542 of the division controller 354 includes PMOS/NMOS transistors P1, N1, NAND gates NAND1, NAND2 and a latch LATCH. The PMOS transistor P1, connected in series between a power supply voltage VDD terminal and a ground voltage VSS terminal, charges a locking node LK_NODE with the power supply voltage VDD in a deactivation section of the auto training operation signal AUTO_WCK2CK. The NMOS transistor N1 discharges the locking node LK_NODE to the ground voltage VSS in an activation section of the comparison section signal COMP_SEL_SIG.

The latch LATCH prevents the electric potential level of the locking node LK_NODE from being floated and outputs a pre-clock locking signal PRE_CLK_LOCKb. The first NAND gate NAND1 receives the auto training operation signal AUTO_WCK2CK and the pre-clock locking signal PRE_CLK_LOCKb, performs a NAND operation on the received signals, and outputs the result signal of the NAND operation. The second NAND gate NAND2 receives the selection clock MULTI_DIV_WCK_90 and the clock locking signal CLK_LOCKb, performs a NAND operation on the received signals, and outputs the result signal of the NAND operation.

A first inverter INV1 and a second inverter INV2 are further included. The first inverter INV1 receives the output signal of the first NAND gate NAND1, inverts the phase of the received signal, and outputs the inverted signal as the clock locking signal CLK_LOCKb. The second inverter INV2 receives the output signal of the second NAND gate NAND2, inverts the phase of the received signal, and outputs the inverted signal as the counting clock COUNTING_CLK.

Referring to FIG. 6B, the comparison information signal generator 3544 of the division controller 354 includes a plurality of flip-flops. The plurality of flip-flops 3544A-C and 3544D-F are connected in a serial chain type corresponding to the output signals COMPARE_SIG_90 and COMPARE_SIG_270 of the phase comparator 352, respectively. Since the output signals COMPARE_SIG_90 and COMPARE_SIG_270 of the phase comparator 352 is inputted to the first flip-flops, i.e., 3544A and 3544D, respectively at each time corresponding to the counting clock COUNTING_CLK, the flip-flops 3544A-C and 3544D-F sequentially generates the respective comparison information signals COMPARE_SIG_90A-C and COMPARE_SIG_270A-C in response to the toggling of the counting clock COUNTING_CLK.

Any one of the output signals COMPARE_SIG_90 and COMPARE_SIG_270 of the phase comparator 352 of the second phase detecting unit 350 is a signal corresponding to the first selection clock MULTI_DIV_WCK_90 having a 90-degree phase difference with respect to the data division clock DIV_WCK, the other signal is a signal corresponding to the second selection clock MULTI_DIV_WCK_270 having a 270-degree phase difference with respect to the data division clock DIV_WCK. Accordingly, the shift times of the logic levels of the output signals COMPARE_SIG_90 and COMPARE_SIG_270 are different from each other.

Therefore, the shift times of the logic levels of the comparison information signals COMPARE_SIG_90A-C and COMPARE_SIG_270A-C, which are generated in correspondence with the output signals COMPARE_SIG_90 and COMPARE_SIG_270, are different from one another. To solve this, the comparison information signal generator 3544 further includes a synchronization flip-flop 3544S.

In FIG. 6B, the synchronization flip-flop 3544S synchronizes the output signal COMPARE_SIG_90 corresponding to the first selection clock MULTI_DIV_WCK_90 having a 90-degree phase difference with respect to the data division clock DIV_WCK with the second selection clock MULTI_DIV_WCK_270 in order for the comparison information signals COMPARE_SIG_90A-C and COMPARE_SIG_270-C to be generated in synchronization with the shift time of the logic level of the second selection clock MULTI_DIV_WCK_270 having a 270-degree phase difference with respect to the data division clock DIV_WCK.

Referring to FIG. 6C, the logic level determiner 3546 of the division controller 354 includes a first logic level determiner 3546A, a second logic level determiner 3546B, and a third logic level determiner 3546C.

The first logic level determiner 3546A determines the logic level of the comparison section signal COMP_SEL_SIG in response to the comparison information signals COMPARE_SIG_90A-C and COMPARE_SIG_270A-C at a time when all the logic levels of the comparison information signals COMPARE_SIG_90A-C and COMPARE_SIG_270A-C are determined, i.e., a time during which the phase comparing operation of the first selection clock MULTI_DIV_WCK_90, the second selection clock MULTI_DIV_WCK_270 and the system clock HCK is repeated by the number of predetermined times. The second logic level determiner 3546B determines the logic level of a reset signal RESETb for initializing the comparison section signal COMP_SEL_SIG and the division control signal DVD_REVERSE at the entry time of the auto training mode in response to the auto training operation signal AUTO_WCK2CK. The third logic level determiner 3546C determines the logic level of the division control signal DVD_REVERSE in response to the comparison section signal COMP_SEL_SIG and the reset signal RESETb.

Herein, the first logic level determiner 3546A includes a plurality of inverters INV1-10 and a plurality of XNOR gates EX_NOR1-6, and a plurality of NAND gate NAND1-4.

The plurality of inverters INV1, INV3 and INV5 and the plurality of XNOR gates EX_NOR1, EX_NOR3 and EX_NOR5 receive the power supply voltage VDD and the comparison information signals COMPARE_SIG_90A-C corresponding to the first selection clock MULTI_DIV_WCK_90, and perform an XOR operation on the received signals to detect whether the logic levels of the received signals are the same as one another. The plurality of inverters INV2, INV4 and INV6 and the plurality of XNOR gates EX_NOR2 , EX_NOR4 and EX_NOR6 receive the ground voltage VSS and the comparison information signals COMPARE_SIG_270A-C corresponding to the second selection clock MULTI_DIV_WCK_270, and perform an XOR operation on the received signals to detect whether the logic levels of the received signals are the same as one another.

The inverter INV7 and the NAND gate NAND1 receive the output signals of the inverters INV1 and INV2 and the XNOR gates EX_NOR1 and EX_NOR2 corresponding to the comparison information signals COMPARE_SIG_90A and COMPARE_SIG_270A, the shift times of the logic levels of which are synchronized with each other, among the comparison information signals, and perform a AND operation on the received signals to generate a synchronization intermediate comparison signal COMPARE_OUT_A. The inverter INV8 and the NAND gate NAND2 receive the output signals of the inverters INV3 and INV4 and the XNOR gates EX_NOR3 and EX_NOR4 corresponding to the comparison information signals COMPARE_SIG_90B and COMPARE_SIG_270B, the shift times of the logic levels of which are synchronized with each other, among the comparison information signals, and perform an AND operation on the received signals to generate a synchronization intermediate comparison signal COMPARE_OUT_B. The inverter INV9 and the NAND gate NAND3 receive the output signals of the inverters INV5 and INV6 and the XNOR gates EX_NOR5 and EX_NOR6 corresponding to the comparison information signals COMPARE_SIG_90C and COMPARE_SIG_270C, the shift times of the logic levels of which are synchronized with each other, among the comparison information signals, and perform an AND operation on the received signals to generate a synchronization intermediate comparison signal COMPARE_OUT_C.

The inverter INV10 and the NAND gate NAND4 simultaneously receive all the synchronization intermediate comparison signals COMPARE_OUT_A, COMPARE_OUT_B and COMPARE_OUT_C, perform an AND operation on the received signals, and output the result signal of the AND operation as the comparison section signal COMP_SEL_SIG.

The second logic level determiner 3546B includes a delay DELAY and an inverter INV11 delaying the auto training operation signal AUTO_WCK2CK by a predetermined time, inverting the phase of the delayed signal and outputting the inverted signal, and a NAND gate NAND5 receiving the auto training operation signal AUTO_WCK2Ck and the output signal of the delay DELAY and the inverter INV11, performing a NAND operation on the received signals and outputting the result signal of the NAND operation as the reset signal RESETb.

The third logic level determiner 3546C includes a PMOS transistor P1, an NMOS transistor N1, and a latch LATCH. The PMOS transistor P1 is connected in series between the power supply voltage VDD terminal and a division control node DR_NODE to charge the division control node DR_NODE with the power supply voltage VDD in an activation section of the reset signal RESETb. The NMOS transistor N1 discharges the division control node DR_NODE to the ground voltage VSS in the activation section of the comparison section signal COMP_SEL_SIG. The latch LATCH prevents the electric potential level of the division control node DR_NODE from being floated, inverts the phase of the signal of the division control node DR_NODE, and outputs the inverted signal as the division control signal DVD_REVERSE.

Additionally, the detailed circuits of the division controller 354 of FIGS. 6A to 6C are merely embodiments for clarity, and they may actually be configured in circuit types which are different from the circuit types of FIGS. 6A to 6C. That is, circuits capable of fully performing the operation of the division controller 354 to be described below may be included and used in an embodiment of the present invention instead of the detail circuits of the division controller 354 of FIGS. 6A to 6C.

The operations of the elements of the circuit for performing the clock alignment training in accordance with an embodiment of the present invention will be described below on the basis of the above-described configuration.

First, since the frequency of the data clock WCK is higher than the frequency of the system clock HCK, the clock dividing unit 320 divides the frequency of the data clock WCK at a suitable level, and allows the data division clock DIV_WCK, which is generated according to the results of the division, to have the same frequency as that of the system clock HCK.

At this point, when the division control signal DVD_REVERSE is activated to logic high, the clock dividing unit 320 inverts the phase of the data division clock DIV_WCK under current generation and outputs the inverted clock. On the other hand, when the division control signal DVD_REVERSE is deactivated to logic low, the clock dividing unit 320 does not invert the phase of the data division clock DIV_WCK under current generation and outputs the data division clock DIV_WCK as it is.

That is, the clock dividing unit 320 generates the data division clock DIV_WCK having the same frequency as that of the system clock HCK in response to the data clock WCK, and can change whether it inverts the phase of the generated data division clock DIV_WCK according to the division control signal DVD_REVERSE.

The first phase detecting unit 340 detects the phase difference of the data division clock DIV_WCK with respect to the phase of the system clock HCK in the normal training mode corresponding to the activation section of the normal training operation signal NORMAL_WCK2CK. That is, the first phase detecting unit 340 detects whether the data division clock DIV_WCK is in a logic high state or a logic low state at the rising edge of the system clock HCK. When the data division clock DIV_WCK is in the logic high state, the first phase detecting unit 340 generates the detection signal DET_SIG, which is activated to logic high. When the data division clock DIV_WCK is in the logic low state, the first phase detecting unit 340 generates the detection signal DET_SIG which is deactivated to logic low.

On the other hand, the first phase detecting unit 340 detects whether the data division clock DIV_WCK is in a logic high state or a logic low state at the falling edge of the system clock HCK. When the data division clock DIV_WCK is in the logic high state, the first phase detecting unit 340 generates the detection signal DET_SIG which is deactivated to logic low. When the data division clock DIV_WCK is in the logic low state, the first phase detecting unit 340 generates the detection signal DET_SIG which is activated to logic high.

The generated detection signal DET_SIG is transmitted to the external controller through the signal transmitting unit 360 as the training information signal TRAINING_INFO_SIG. The external controller changes the phase of the data clock WCK in response to the detection signal DET_SIG to complete the clock alignment training operation in the normal training mode.

The phase dividing unit 330 generates eight multiple-phase data division clocks MULTI_DIV_WCK_0, MULTI_DIV_WCK_45, MULTI_DIV_WCK_90, MULTI_DIV_WCK_135, MULTI_DIV_WCK_180, MULTI_DIV_WCK_225, MULTI_DIV_WCK_270, and MULTI_DIV_WCK_315 having a 45-degree phase difference; four multiple-phase data division clocks MULTI_DIV_WCK_0, MULTI_DIV_WCK_90, MULTI_DIV_WCK_180, and MULTI_DIV_WCK_270 having a 90-degree phase difference; or two multiple-phase data division clocks MULTI_DIV_WCK_0 and MULTI_DIV_WCK_180 having a 180-degree phase difference in response to the data division clock DIV_WCK.

Additionally, the number of the multiple-phase data division clocks MULTI_DIV_WCK_x which are generated in response to the data division clock DIV_WCK may be varied according to the design of a designer. That is, the number of the multiple-phase data division clocks MULTI_DIV_WCK_x, which are generated in response to the data division clock DIV_WCK may be sixteen or thirty-two, in addition to two, four, and eight. Moreover, the number of the multiple-phase data division clocks MULTI_DIV_WCK_x may be more than thirty-two. An embodiment of the present invention will describe a case that it generates the four multiple-phase data division clocks MULTI_DIV_WCK_0, MULTI_DIV_WCK_90, MULTI_DIV_WCK_180, and MULTI_DIV_WCK_270 having the 90-degree phase difference in response to the data division clock DIV_WCK.

The phase comparator 352 of the second phase detecting unit 350 detects the phase difference of the system clock HCK with respect to the phases of the two selection clocks MULTI_DIV_WCK_90 and MULTI_DIV_WCK_270, which are not the same as and are contrary to the phase of the data division clock DIV_WCK, among the four multiple-phase data division clocks in the auto training mode corresponding to the activation section of the auto training operation signal AUTO_WCK2CK.

That is, the phase comparator 352 detects whether the system clock HCK is in a logic high state or a logic low state at the rising edges of the respective two selection clocks MULTI_DIV_WCK_90 and MULTI_DIV_WCK_270. When the system clock HCK is in the logic high state, the phase comparator 352 generates the output signals COMPARE_SIG_90 and COMPARE_SIG_270, which are activated to logic high. When the system clock HCK is in the logic low state, the phase comparator 352 generates the output signals COMPARE_SIG_90 and COMPARE_SIG_270, which are deactivated to logic low.

On the other hand, the phase comparator 352 detects whether the system clock HCK is in a logic high state or a logic low state at the falling edges of the respective two selection clocks MULTI_DIV_WCK_90 and MULTI_DIV_WCK_270. When the system clock HCK is in the logic high state, the phase comparator 352 generates the output signals COMPARE_SIG_90 and COMPARE_SIG_270, which are deactivated to logic low. When the system clock HCK is in the logic low state, the phase comparator 352 generates the output signals COMPARE_SIG_90 and COMPARE_SIG_270, which are activated to logic high.

When the output signals COMPARE_SIG_90 and COMPARE_SIG_270 which are outputted from the phase comparator 352 of the second phase detecting unit 350 maintain the same logic level during the operation section of the auto training mode, the division controller 354 of the second phase detecting unit 350 changes the logic level of the division control signal DVD_REVERSE.

At this point, the maintenance time of the operation section of the auto training mode is time at which a cycle of any one of the two selection clocks MULTI_DIV_WCK_90 and MULTI_DIV_WCK_270 is repeated by the number of predetermined times.

That is, the phase comparator 352 compares the phases of the two selection clocks MULTI_DIV_WCK_90 and MULTI_DIV_WCK_270 with the phase of the system clock HCK, which is repeated by the number of predetermined times during the maintenance time of the operation section of the auto training mode. When the signals COMPARE_SIG_90 and COMPARE_SIG_270, which are outputted according to the comparison results, repeatedly have the same logic level during the number of the predetermined times, the phase comparator 352 changes the logic level of the division control signal DVD-REVERSE in response to the signals COMPARE_SIG_90 and COMPARE_SIG_270.

For example, when the output signal COMPARE_SIG_90 corresponding to the first selection clock MULTI_DIV_WCK_90 having a 90-degree phase difference with respect to the data division clock DIV_WCK continuously maintains a logic high state and the output signal COMPARE_SIG_270 corresponding to the second selection clock MULTI_DIV_WCK_270 having a 270-degree phase difference with respect to the data division clock DIV_WCK continuously maintains a logic low state during the operation section of the auto training mode, the phase comparator 352 unconditionally deactivates the logic level of the division control signal DVD_REVERSE to logic low irrespective of the current state of the logic level of the division control signal DVD_REVERSE.

On the other hand, when the output signal COMPARE_SIG_90 continuously maintains a logic low state and the output signal COMPARE_SIG_270 continuously maintains a logic high state during the operation section of the auto training mode, the phase comparator 352 unconditionally activates the logic level of the division control signal DVD_REVERSE to logic high irrespective of the current state of the logic level of the division control signal DVD_REVERSE.

If the output signals COMPARE_SIG_90 and COMPARE_SIG_270 of the phase comparator 352 do not maintain the same logic level during the operation section of the auto training mode, the phase comparator 352 does not change the current logic level of the division control signal DVD_REVERSE.

In the above-described embodiment, it has been described that the phase comparator 352 outputs the output signals COMPARE_SIG_90 and COMPARE_SIG_270 and the logic level of the division control signal DVD_REVERSE is determined according to the output signals COMPARE_SIG_90 and COMPARE_SIG_270, but this embodiment is for clarity. The operations of an embodiment of the present invention are optional operations capable of being changed by a designer.

That is, the phase comparator 352 may compare the phase of the selection clock MULTI_DIV_WCK_90, which has a 90-degree phase difference with respect to the data division clock DIV_WCK, with the phase of the system clock HCK, which is repeated by the number of predetermined times during the maintenance time of the operation section of the auto training mode. When the signal COMPARE_SIG_90, which is outputted according to the comparison result repeatedly has the same logic level during the number of the predetermined times, the phase comparator 352 changes the logic level of the division control signal DVD-REVERSE in response to the signal COMPARE_SIG_90.

The phase comparator 352 also outputs four or more signals, in addition to two signals, and the logic level of the division control signal DVD_REVERSE may be determined according to the output signals of the phase comparator 352.

Additionally, when the phase comparator 352 repeatedly operates several times as described above, the operation result of the division controller 354 is outputted according to the repetition operation of the phase comparator 352. This is because an inaccurate data result may be obtained due to an unknown error or noise when the division controller 354 operates with the comparison result only once. That is, the above-described operations of an embodiment of the present invention are merely for preventing an inaccurate data result from exerting influence on the total operations of the circuit, and these operations are optional operations capable of being changed by a designer.

Specifically, the operations of the elements of the division controller 354 are described hereafter.

Referring to FIG. 6A, in the operation of the counting clock generator 3542, when the auto training operation signal AUTO_WCK2CK is deactivated to logic low before entering the operation section of the auto training mode, the counting clock generator 3542 generates the pre-clock locking signal PRE_CLK_LOCKb of a logic high state by charging the locking node LK_NODE with the power supply voltage VDD.

In this way, both the pre-clock locking signal PRE_CLK_LOCKb activated to logic high and the auto training operation signal AUTO_WCK2CK, which is activated to logic high while entering the operation section of the auto training mode, activate the clock locking signal CLK_LOCKb to logic high together.

As described above, both the clock locking signal CLK_LOCKb activated to logic high and the selection clocks MULTI_DIV_WCK_90/270 toggle the counting clock COUNTING_CLK together. At this point, the first selection clock MULTI_DIV_WCK_90 is used in an embodiment of the present invention of FIG. 6A, but this embodiment is merely for clarity. That is, the second selection clock MULTI_DIV_WCK_270 may be used instead of the first selection clock MULTI_DIV_WCK_90. Moreover, when the counting clock generator 3542 receives another clock, it may be used.

Subsequently, the auto training operation signal AUTO_WCK2CK is deactivated to logic low while exiting from the operation section of the auto training mode, the clock locking signal CLK_LOCKb is also deactivated to logic low according to the auto training operation signal AUTO_WCK2CK so that the toggling of the counting clock COUNTING_CLK is stopped.

Moreover, when the comparison section signal COMP_SEL_SIG is activated to logic high even in the operation section of the auto training mode independently from the logic level of the auto training operation signal AUTO_WCK2CK, the pre-clock locking signal PRE_CLK_LOCKb is deactivated to logic low so that the clock locking signal CLK_LOCKb is also deactivated to logic low. Consequently, the toggling of the counting clock COUNTING_CLK is stopped according to the pre-clock locking signal PRE_CLK_LOCKb and the clock locking signal CLK_LOCKb.

That is, the purpose of the counting clock generator 3542 is to toggle the counting clock COUNTING_CLK, which is synchronized with the selection clocks MULTI_DIV_WCK_90 and MULTI_DIV_WCK_270 in the operation section of the auto training mode. Simultaneously, when the comparison section signal COMP_SEL_SIG is activated to logic high in the operation section of the auto training mode, the counting clock COUNTING_CLK, which is synchronized with the selection clocks MULTI_DIV_WCK_90 and MULTI_DIV_WCK_270 is toggled. When the comparison section signal COMP_SEL_SIG is deactivated to logic low even in the operation section of the auto training mode, the counting clock COUNTING_CLK is not toggled regardless of the selection clocks MULTI_DIV_WCK_90 and MULTI_DIV_WCK_270.

In operation of the comparison information signal generator 3544, among the output signals COMPARE_SIG_90 and COMPARE_SIG_270 of the phase comparator 352, the output signal COMPARE_SIG_90 corresponding to the first selection clock MULTI_DIV_WCK_90 having a 90-degree phase difference with respect to the data division clock DIV_WCK is activated or deactivated before the output signal COMPARE_SIG_270 corresponding to the second selection clock MULTI_DIV_WCK_270 having a 270-degree phase difference with respect to the data division clock DIV_WCK. Thus, the synchronization flip-flop 3544S generates the start signal COMPARE_SIG_90S corresponding to the first selection clock MULTI_DIV_WCK_90 in response to the signal COMPARE_SIG_90. The start signal COMPARE_SIG_90S is generated on the basis of the rising edge or falling edge of the second clock MULTI_DIV_WCK_270.

The flip-flops 3544A, 3544B and 3544C connected in the serial chain type generate a first A comparison information signal COMPARE_SIG_90A which is activated or deactivated in response to the start signal COMPARE_SIG_90S on the basis of the rising edge or falling edge of the counting clock COUNTING_CLK, generate a first B comparison information signal COMPARE_SIG_90B which is activated or deactivated in response to the first A comparison information signal COMPARE_SIG_90A on the basis of the rising edge or falling edge of a successive counting clock COUNTING_CLK. This generates a first C comparison information signal COMPARE_SIG_90C, which is activated or deactivated in response to the first B comparison information signal COMPARE_SIG_90B on the basis of the rising edge or falling edge of a successive counting clock COUNTING_CLK.

For example, when the output signal COMPARE_SIG_90 corresponding to the first selection clock MULTI_DIV_WCK_90 is activated to logic high, the synchronization flip-flop 3544S activates the start signal COMPARE_SIG_90S corresponding to the first selection clock MULTI_DIV_WCK_90 to logic high at the rising edge or falling edge of the second selection clock MULTI_DIV_WCK_270.

In this way, when the start signal COMPARE_SIG_90S corresponding to the first selection clock MULTI_DIV_WCK_90 is activated to logic high, the first flip-flop 3544A activates the first A comparison information signal COMPARE_SIG_90A to logic high at the rising edge or falling edge of a counting clock COUNTING_CLK succeeding the counting clock COUNTING_CLK input to the synchronization flip-flop 3544S.

When the first A comparison information signal COMPARE_SIG_90A is activated to logic high, the second flip-flop 3544B activates the first B comparison information signal COMPARE_SIG_90B to logic high at the rising edge or falling edge of a counting clock COUNTING_CLK succeeding the counting clock COUNTING_CLK input to the first flip-flop 3544A. Likewise, when the first B comparison information signal COMPARE_SIG_90B is activated to logic high, the third flip-flop 3544C activates the first C comparison information signal COMPARE_SIG_90C to logic high at the rising edge or falling edge of a counting clock COUNTING_CLK succeeding the counting clock COUNTING_CLK inputted to the first flip-flop 3544B.

The respective flip-flops 3544D, 3544E, and 3544F connected in the serial chain type generate a second A comparison information signal COMPARE_SIG_270A, which is activated or deactivated in response to the output signal COMPARE_SIG_270 corresponding to the second selection clock MULTI_DIV_WCK_270 on the basis of the rising edge or falling edge of the counting clock COUNTING_CLK, generate a second B comparison information signal COMPARE_SIG_270B, which is activated or deactivated in response to the second A comparison information signal COMPARE_SIG_270A on the basis of the rising edge or falling edge of a successive counting clock COUNTING_CLK, and generates a second C comparison information signal COMPARE_SIG_270C, which is activated or deactivated in response to the second B comparison information signal COMPARE_SIG_270B on the basis of the rising edge or falling edge of a successive counting clock COUNTING_CLK.

For example, when the output signal COMPARE_SIG_270 corresponding to the second selection clock MULTI_DIV_WCK_270 is activated to logic high, the first flip-flop 3544D activates the second A comparison information signal COMPARE_SIG_270A to logic high at the rising edge or falling edge of the counting clock COUNTING_CLK.

When the second A comparison information signal COMPARE_SIG_270A is activated to logic high, the second flip-flop 3544E activates the second B comparison information signal COMPARE_SIG_270B to logic high at the rising edge or falling edge of a counting clock COUNTING_CLK succeeding the counting clock COUNTING_CLK input to the second flip-flop 3544D. Likewise, when the second B comparison information signal COMPARE_SIG_270B is activated to logic high, the third flip-flop 3544F activates the second C comparison information signal COMPARE_SIG_270C to logic high at the rising edge or falling edge of a counting clock COUNTING_CLK succeeding the counting clock COUNTING_CLK inputted to the second flip-flop 3544E.

In the operation of the first logic level determiner 3546A of the logic level determiner 3546, the first logic level determiner 3546A detects whether the comparison information signals COMPARE_SIG_90A, COMPARE_SIG_90B, COMPARE_SIG_90C, COMPARE_SIG_270A, COMPARE_SIG_270B and COMPARE_SIG_270C have a predetermined logic level at a time when all the logic levels of the comparison information signals are determined by the completion of all the operations of the comparison information signal generator 3544, i.e., a time during which the phase comparing operation of the first selection clock MULTI_DIV_WCK_90, the second selection clock MULTI_DIV_WCK_270, and the system clock HCK is repeated by the number of predetermined times, and determines the logic level of the comparison section signal COMP_SEL_SIG according to the detection result.

For example, when all the comparison information signals COMPARE_SIG_90A-C corresponding to the first selection clock MULTI_DIV_WCK_90 are activated to logic high, the output signals of the XNOR gates EX_NOR1, 3 and 5 and inverters INV1, 3 and 5 corresponding to the comparison information signals COMPARE_SIG_90A-C become logic low. Likewise, when all the comparison information signals COMPARE_SIG_270A-C corresponding to the second selection clock MULTI_DIV_WCK_270 are deactivated to logic low, the output signals of the XNOR gates EX_NOR2, 4 and 6 and inverters INV2, 4 and 6 corresponding to the comparison information signals COMPARE_SIG_270A-C becomes logic low.

In this way, since all the output signals of the respective inverters INV1-6 become logic low, all the synchronization intermediate comparison signals COMPARE_OUT_A-C also become logic low. The comparison section signal COMP_SEL_SIG is deactivated to logic low according to the logic levels of the synchronization intermediate comparison signals COMPARE_OUT_A-C.

In addition, when the comparison information signals COMPARE_SIG_90A-C are deactivated to logic low and the comparison information signals COMPARE_SIG_270A-C are activated to logic high, the output signals of the respective inverters INV1, INV3, and INV5 become logic high and the output signals of the respective inverters INV2, INV4 and INV6 become logic high. In this way, since all the output signals of the respective inverters INV1-6 become logic high, all the synchronization intermediate comparison signals COMPARE_OUT_A-C also become logic high. The comparison section signal COMP_SEL_SIG is activated to logic high according to the logic levels of the synchronization intermediate comparison signals COMPARE_OUT_A-C.

In operation of the second logic level determiner 3546B of the logic level determiner 3546, the second logic level determiner 3546B generates the reset signal RESETb, which is deactivated to logic low during a predetermined time corresponding to the delay time of the delay DELAY at the moment when the auto training operation signal AUTO_WCK2CK is activated to logic high and the auto training mode is entered.

In operation of the third logic level determiner 3546C of the logic level determiner 3546, when the reset signal RESETb is deactivated to logic low by entering the operation section of the auto training mode, the third logic level determiner 3546C deactivates the division control signal DVD_REVERSE to logic low by charging the division control node DR_NODE with the power supply voltage VDD. Subsequently, when the comparison section signal COMP_SEL_SIG is activated to logic high in the operation section of the auto training mode, the logic level determiner 3546 activates the division control signal DVD_REVERSE of the deactivation state of logic low to logic high by discharging the division control node DR_NODE to the ground voltage VSS according to the activation of the comparison section signal COMP_SEL_SIG.

On the other hand, when the comparison section signal COMP_SEL_SIG continuously maintains the deactivation state of logic low in the operation section of the auto training mode, the logic level determiner 3546 continuously maintains the deactivation state of the division control signal DVD_REVERSE of logic low by preventing the electric potential level of the power supply voltage VDD of the division control node DVD_NODE from being floated according to the deactivation of the comparison section signal COMP_SEL_SIG.

FIG. 7 is a timing diagram of input/output signals for describing the non-inversion operation of the circuit for performing the clock alignment training in accordance with an embodiment of the present invention.

Referring to FIG. 7, in the non-inversion operation of the circuit for performing the clock alignment training in accordance with an embodiment of the present invention, the phase of the data division clock DIV_WCK is synchronized with the phase of the system clock HCK even after exiting from the power down mode which has been entered. Accordingly, the division control signal DVD_REVERSE is deactivated to logic low from the start to the end.

Additionally, although the data clock WCK and the data division clock DIV_WCK are not directly illustrated in FIG. 7, the first multiple-phase data division clock MULTI_DIV_WCK_0 of the multiple-phase data division clocks has the same phase as that of the data division clock DIV_WCK. Moreover, the frequency of the data division clock DIV_WCK is different from that of the data clock WCK, but the data division clock DIV_WCK and the data clock WCK have the same phase.

Specifically, the auto sync operation entry signal AUTOSYNC_ENTRY is preferentially activated to logic high before the entry of the power down mode. This means that the normal training mode is completed before the entry of the power down mode so that the data clock WCK and the data division clock DIV_WCK are synchronized with the system clock HCK.

Accordingly, when the clock alignment training operation entry signal WCK2CK_ENTRY is activated after exiting from the power down mode and the clock alignment training operation is entered, the auto training operation signal AUTO_WCK2CK is activated without condition so that the auto training mode is entered.

When the auto training operation signal AUTO_WCK2CK is activated and the auto training mode is entered, the clock locking signal CLK_LOCKb is activated according to the entry of the auto training mode, and consequently the counting clock COUNTING_CLK is toggled. Moreover, the reset signal RESETb is activated to logic low during a predetermined time at the moment when the auto training operation signal AUTO_WCK2CK is activated so that the auto training mode is entered.

The logic levels of the respective comparison information signals COMPARE_SIG_90A, COMPARE_SIG_90B. COMPARE_SIG_90C, COMPARE_SIG_270A, COMPARE_SIG_270B, and COMPARE_SIG_270C can be determined according to the toggling of the counting clock COUNTING_CLK.

At this point, since the phase of the data division clock DIV_WCK is synchronized with that of the system clock HCK, among the respective comparison information signals COMPARE_SIG_90A, COMPARE_SIG_90B, COMPARE_SIG_90C, COMPARE_SIG_270A, COMPARE_SIG_270B, and COMPARE_SIG_270C, all the first comparison information signals COMPARE_SIG_90A, COMPARE_SIG_90B, and COMPARE_SIG_90C corresponding to the first selection clock MULTI_DIV_WCK_90 having a 90-degree phase difference with respect to the data division clock DIV_WCK are activated to logic high, and all the second comparison information signals COMPARE_SIG_270A, COMPARE_SIG_270B, and COMPARE_SIG_270C corresponding to the second selection clock MULTI_DIV_WCK_270 having a 270-degree phase difference with respect to the data division clock DIV_WCK are deactivated to logic low.

Accordingly, all the synchronization intermediate comparison signals COMPARE_OUT_A, COMPARE_OUT_B and COMPARE_OUT_C become logic low, and consequently the comparison section signal COMP_SEL_SIG and the division control signal DVD_REVERSE maintain a logic low state.

Figure 8:
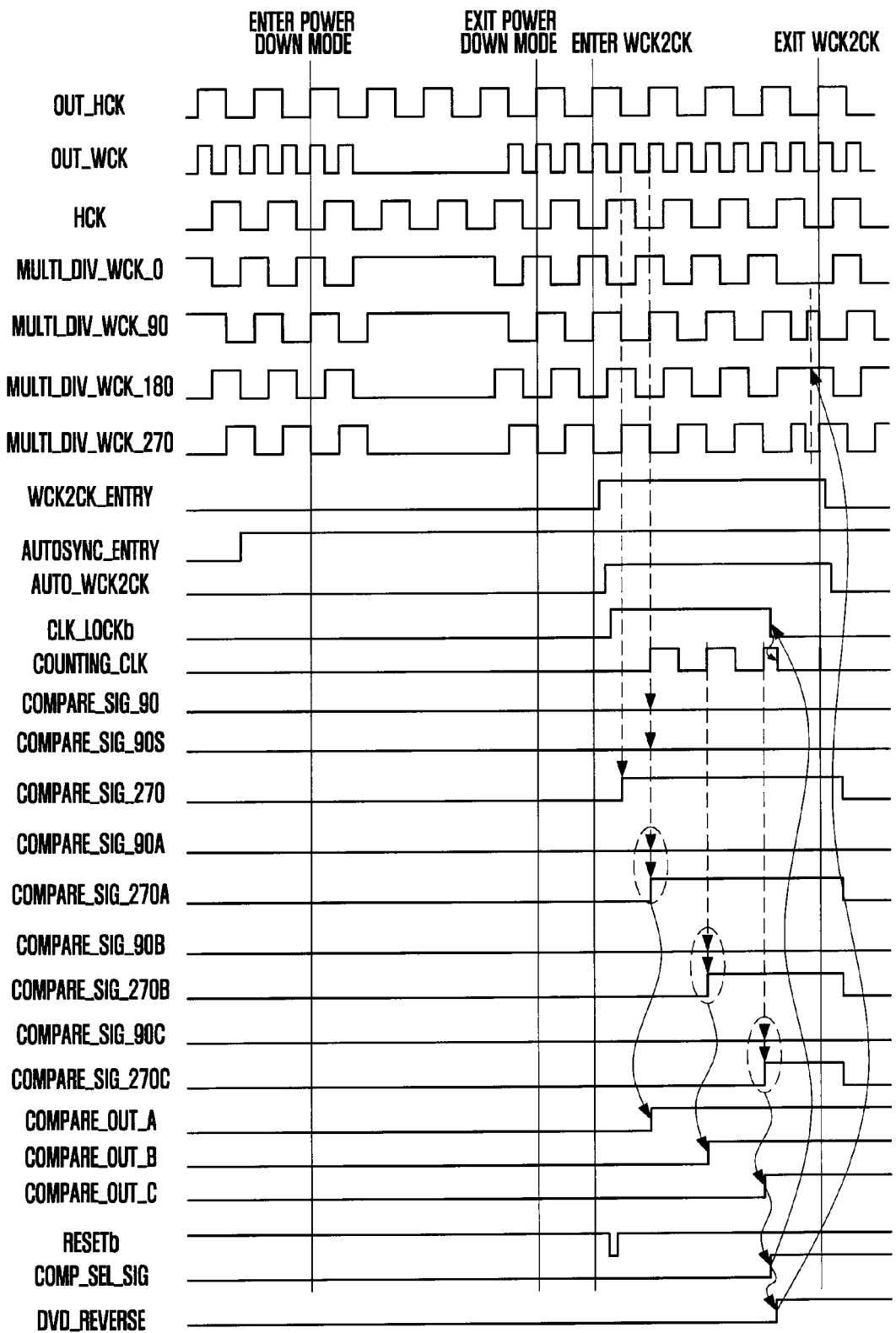
FIG. 8 is a timing diagram of input/output signals for describing an inversion operation of the circuit for performing the clock alignment training in accordance with an embodiment of the present invention.

FIG. 8 is a timing diagram of input/output signals for describing the inversion operation of the circuit for performing the clock alignment training in accordance with an embodiment of the present invention.

Referring to FIG. 8, in the inversion operation of the circuit for performing the clock alignment training in accordance with an embodiment of the present invention, the phase of the data division clock DIV_WCK is not synchronized with the phase of the system clock HCK even after exiting from the power down mode which has been entered. Accordingly, the division control signal DVD_REVERSE is deactivated to logic low at first, and then it inverts the phase of the data division clock DIV_WCK while being activated to logic high later.

Additionally, although the data clock WCK and the data division clock DIV_WCK are not directly illustrated in FIG. 8, the first multiple-phase data division clock MULTI DIV_WCK_0 of the multiple-phase data division clocks MULTI_DIV_WCK_0 , MULTI_DIV_WCK_90, MULTI_DIV_WCK_180 and MULTI_DIV_WCK_270 has the same phase as that of the data division clock DIV_WCK. Moreover, the frequency of the data division clock DIV_WCK is different from that of the data clock WCK, but the data division clock DIV_WCK and the data clock WCK have the same phase.

Specifically, the auto sync operation entry signal AUTO-SYNC_ENTRY is preferentially activated to logic high before the entry of the power down mode. This means that the normal training mode is completed before the entry of the power down mode so that the data clock WCK and the data division clock DIV_WCK are synchronized with the system clock HCK.

Accordingly, when the clock alignment training operation entry signal WCK2CK_ENTRY is activated after exiting from the power down mode and the clock alignment training operation is entered, the auto training operation signal AUTO_WCK2CK is activated without condition so that the auto training mode is entered.

When the auto training operation signal AUTO_WCK2CK is activated and the auto training mode is entered, the clock locking signal CLK_LOCKb is activated according to the entry of the auto training mode, and consequently the counting clock COUNTING_CLK is toggled.

Moreover, the reset signal RESETb is deactivated to logic low during a predetermined time at the moment where the auto training operation signal AUTO_WCK2CK is activated so that the auto training mode is entered. The logic levels of the respective comparison information signals COMPARE_SIG_90A, COMPARE_SIG_90B. COMPARE_SIG_90C, COMPARE_SIG_270A, COMPARE_SIG_270B, and COMPARE_SIG_270C can be determined according to the toggling of the counting clock COUNTING_CLK.

At this point, since the phase of the data division clock DIV_WCK is not synchronized with that of the system clock HCK, among the respective comparison information signals, all the first comparison information signals COMPARE_SIG_90A, COMPARE_SIG_90B, and COMPARE_SIG_90C corresponding to the first selection clock MULTI_DIV_WCK_90 having a 90-degree phase difference with respect to the data division clock DIV_WCK are deactivated to logic low, and all the second comparison information signals COMPARE_SIG_270A, COMPARE_SIG_270B and COMPARE_SIG_270C corresponding to the second selection clock MULTI_DIV_WCK_270 having a 270-degree phase difference with respect to the data division clock DIV_WCK, are activated to logic high.

Accordingly, all the synchronization intermediate comparison signals COMPARE_OUT_A, COMPARE_OUT_B, and COMPARE_OUT_C become logic high, and consequently the comparison section signal COMP_SEL_SIG and the division control signal DVD_REVERSE are changed from logic low to logic high.

In this way, when the comparison section signal COMP_SEL_SIG is changed into logic high, the clock locking signal CLK_LOCKb is deactivated, and the toggling of the counting clock COUNTING_CLK is stopped according to the change of the comparison section signal COMP_SEL_SIG. Moreover, when the division control signal DVD_REVERSE is changed into logic high, the phase of the data division clock DIV_WCK is inverted according to the change of the division control signal DVD_REVERSE, and consequently the phase of the data division clock DIV_WCK is synchronized with that of the system clock HCK.

As described above, in the embodiments of the present invention, the auto clock alignment training mode is added that can be applied in the entry/exit operation of an operation mode such as the power down mode, which is entered in a state where the phase of the data clock WCK is already synchronized with the phase of the system clock HCK through the normal clock alignment training operation.

Therefore, the semiconductor memory device operates by determining only whether the phase of the data clock WCK is inverted with respect to that of the system clock HCK after exiting from the operation mode such as the power down mode. Accordingly, the semiconductor memory device can synchronize the phase of the data clock WCK with that of the system clock HCK at very high speed after exiting from the operation mode such as the power down mode.

Embodiments of the present invention enables the semiconductor memory device to perform the auto clock alignment training mode used upon entry/exit operation of the operation mode such as the power down mode, and thus the semiconductor memory device can operate by only determining whether the data clock WCK is inverted after exiting from the operation mode such as the power down mode. Accordingly, the semiconductor memory device can synchronize the phase of the data clock WCK with the phase of the system clock HCK at very high speed.

While the present subject matter has been described with respect to the specific embodiments, it will be apparent to those skilled in the art that various changes and modifications may be made without departing from the spirit and scope of the invention as defined in the following claims.

For example, in the embodiments described above, the positions and kinds of the logic gates and the transistors must be embodied in different forms according to the polarity of an input signal.

What is claimed is:

1. A semiconductor memory device, comprising:
   a clock inputting unit configured to generate a system clock and a data clock;
   a clock dividing unit configured to generate a data division clock by dividing a frequency of the data clock and to determine a phase of the data division clock according to a division control signal;
   a phase dividing unit configured to generate a plurality of multiple-phase data division clocks, each of which has a predetermined phase difference according to the data division clock; and
   a first phase detecting unit configured to detect a phase of the system clock based on a predetermined selection clock among the multiple-phase data division clocks, and generate the division control signal according to the detection result.

2. The semiconductor memory device of claim 1, wherein the clock inputting unit includes:
   a system clock generator configured to output the system clock in response to a first external clock for synchronizing an input time of an address signal and an input time of a command signal; and
   a data clock generator configured to output the data clock in response to a second external clock for synchronizing an input time of a data signal.

3. The semiconductor memory device of claim 1, wherein the clock dividing unit inverts a phase of the data division clock when the division control signal is activated, and generates the data division clock without inverting the phase when the division control signal is deactivated.

4. The semiconductor memory device of claim 1, wherein the phase dividing unit generates the multiple-phase data division clocks having a 45-degree or 90-degree phase difference according to the data division clock.

5. The semiconductor memory device of claim 4, wherein the selection clock is a multiple-phase data division clock which is not the same as and contrary to the data division clock of the multiple-phase data division clocks.

6. The semiconductor memory device of claim 5, wherein when the respective multiple-phase data division clocks have a 90-degree phase difference, the selection clock has a 90-degree or 270-degree phase difference with respect to the data division clock.

7. The semiconductor memory device of claim 5, wherein when the respective multiple-phase data division clocks have a 45-degree phase difference, the selection clock has a 45-degree, 90-degree, 135-degree, 225-degree, 270-degree, or 315-degree phase difference with respect to the data division clock.

8. The semiconductor memory device of claim 1, wherein the first phase detecting unit includes:
   a phase comparator configured to compare a phase of the selection clock with that of the system clock; and
   a division controller configured to repeatedly receive an output signal of the phase comparator by predetermined times, and change a logic level of the division control signal according to the output signal of the phase comparator.

9. The semiconductor memory device of claim 8, wherein the phase comparator detects whether the system clock is activated at an edge of the selection clock and determines an activation of an output signal.

10. The semiconductor memory device of claim 8, wherein when the output signal of the phase comparator maintains the same logic level during a predetermined time, the division controller changes a logic level of the division control signal according to the output signal of the phase comparator, wherein the predetermined time is a time during which a cycle of the selection clock is repeated by the number of the determined times.

11. The semiconductor memory device of claim 10, wherein the division controller includes:
   a counting clock generator configured to generate a counting clock synchronized with the selection clock in response to a comparison section signal within the predetermined time;
   a comparison information signal generator configured to generate a plurality of comparison information signals, logic levels of which are sequentially determined in response to the output signal of the phase comparator at each time corresponding to the counting clock; and
   a logic level determiner configured to determine a logic level of the comparison section signal and a logic level of the division control signal according to the comparison information signals.

12. The semiconductor memory device of claim 11, wherein the counting clock generator toggles the counting clock in synchronization with the selection clock when the comparison section signal is activated in a section corresponding to the predetermined time.

13. The semiconductor memory device of claim 11, wherein the comparison information signal generator includes a plurality of flip-flops connected in serial chain type,
   wherein the output signal of the phase comparator is inputted to the first flip-flop of the flip-flops at each time corresponding to the counting clock, and the respective flip-flops sequentially generate the respective comparison information signals according to the toggling of the counting clock.

14. The semiconductor memory device of claim 11, wherein the logic level determiner activates the comparison section signal and deactivates the division control signal when all the comparison information signals are activated, and deactivates the comparison section signal and activates the division control signal when all the comparison information signals are deactivated, at a time when all the logic levels of the comparison information signals are determined.

15. The semiconductor memory device of claim 14, wherein the logic level determiner initializes the comparison section signal to an activation state and initializes the division control signal to a deactivation state at a time when the section corresponding to the predetermined time starts.

16. The semiconductor memory device of claim 1, further comprising:
   a second phase detecting unit configured to detect a phase difference between the data division clock and the system clock to generate the training information signal; and
   a signal transmitting unit configured to transmit the training information signal to the outside.

17. The semiconductor memory device of claim 16, wherein the first phase detecting unit operates only in an auto training mode and the second phase detecting unit operates only in the normal training mode.

18. The semiconductor memory device of claim 17, wherein the operation section of the auto training mode and the operation section of the normal training mode are defined in a mode register set.

19. An operation method of a semiconductor memory device, the operation method comprising:
   receiving a system clock and a data clock;
   dividing a frequency of the data clock to generate a data division clock, wherein a phase of the data division clock is determined according to a division control signal;
   sensing an entry of a normal training mode or an entry of an auto training mode;
   generating a plurality of multiple-phase data division clocks having respective predetermined phase differences according to the data division clock when the auto training mode is entered according to the sensing result; and
   detecting a phase of the system clock and a phase of a predetermined selection clock among the multiple-phase data division clocks, and determining a logic level of the division control signal according to the detecting result.

20. The operation method of claim 19, wherein the receiving of the system clock includes:
   receiving a first external clock for synchronizing an input time of an address signal and an input time of a command signal, and outputting the received first external clock as the system clock; and
   receiving a second external clock for synchronizing an input time of a data signal, and outputting the received second external clock as the data clock.

21. The operation method of claim 19, wherein the generating of the data division clock includes:
   dividing a frequency of the data clock irrespective of the division control signal to generate the data division clock in the normal training mode;
   inverting a phase of the data division clock to generate the data division clock according to an activation of the division control signal in the auto training mode; and
   generating the data division clock without inverting the phase of the data division clock according to a deactivation of the division control signal in the auto training mode.

22. The operation method of claim 19, wherein the generating of the multiple-phase data division clocks includes generating the multiple-phase data division clocks having a 45-degree or 90-degree phase difference according to the data division clock.

23. The operation method of claim 22, wherein the selection clock is a multiple-phase data division clock which is not the same as and contrary to the data division clock of the multiple-phase data division clocks.

24. The operation method of claim 23, wherein in the generating of the multiple-phase data division clocks, when the respective multiple-phase data division clocks have a 90-degree phase difference, the selection clock having a 90-degree or 270-degree phase difference with respect to the data division clock among the multiple-phase data division clocks is used as the selection clock.

25. The operation method of claim 23, wherein in the generating of the multiple-phase data division clocks, when the respective multiple-phase data division clocks have a 45-degree phase difference, the selection clock having a 45-degree, 90-degree, 135-degree, 225-degree, 270-degree, or 315-degree phase difference with respect to the data division clock among the multiple-phase data division clocks is used as the selection clock.

26. The operation method of claim 19, wherein the detecting of the phases includes:
   comparing the phase of the selection clock with that of the system clock; and
   repeatedly receiving an output signal according to the result of the phase comparison by the number of predetermined times, and controlling the logic level of the division control signal according to the received output signal.

27. The operation method of claim 26, wherein the comparing of the phases includes detecting whether the system clock is activated at an edge of the selection clock to determine an activation of an output signal.

28. The operation method of claim 26, wherein the logic level of the division control signal is changed according to a logic level of the repeatedly received output signal when the repeatedly received output signal maintains the same logic level, and the logic level of the division control signal is not changed according to a logic level of the repeatedly received output signal when the repeatedly received output signal does not maintain the same logic level.

29. The operation method of claim 26, wherein the receiving of the output signal includes:
   generating a counting clock synchronized with the selection clock according to a comparison section signal corresponding to an operation section of the auto training mode;
   repeatedly receiving the output signal according to the result of the phase comparison at each time corresponding to the counting clock, and generating a plurality of comparison information signals, logic levels of which are sequentially determined, according to the received output signal; and
   determining a logic level of the comparison section signal and a logic level of the division control signal according to the comparison information signals.

30. The operation method of claim 29, wherein in the generating of the counting clock, the counting clock is toggled in synchronization with the selection clock when the comparison section signal is activated, and the counting clock is not toggled irrespective of the selection clock when the comparison section signal is deactivated.

31. The operation method of claim 29, wherein the receiving of the output signal includes:
- repeatedly receiving the output signal according to the result of the phase comparison at each edge of the counting clock; and
- sequentially determining the logic levels of the respective comparison information signals according to the repeatedly received output signal.

32. The operation method of claim 29, wherein the determining of the logic levels includes activating the comparison section signal and deactivating the division control signal when all the comparison information signals are activated at a time when all the logic levels of the comparison information signals are determined.

33. The operation method of claim 29, wherein the determining of the logic levels includes deactivating the comparison section signal and activating the division control signal when all the comparison information signals are deactivated, at a time when all the logic levels of the comparison information signals are determined.

34. The operation method of claim 29, wherein the determining of the logic levels includes initializing the comparison section signal to an activation state, and initializing the division control signal to a deactivation state, at an entry time of the auto training mode.

35. The operation method of claim 19, further comprising:
- detecting a phase difference between the data division clock and the system clock when the normal training mode is entered according to the sensing result, and determining a logic level of a training information signal according to the result of the detection; and
- transmitting the training information signal to the exterior.

* * * * *